United States Patent
Shih et al.

(10) Patent No.: US 9,105,676 B2
(45) Date of Patent: Aug. 11, 2015

(54) METHOD OF REMOVING DAMAGED EPOXY FROM ELECTROSTATIC CHUCK

(71) Applicant: LAM RESEARCH CORPORATION, Fremont, CA (US)

(72) Inventors: Hong Shih, Walnut, CA (US); Tuochuan Huang, Saratoga, CA (US); Yan Fang, Fremont, CA (US); Cliff LaCroix, Livermore, CA (US); Neal Newton, San Jose, CA (US); Rish Chhatre, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 484 days.

(21) Appl. No.: 13/624,822

(22) Filed: Sep. 21, 2012

(65) Prior Publication Data

US 2014/0083461 A1    Mar. 27, 2014

(51) Int. Cl.
B08B 7/00    (2006.01)
H01L 21/683    (2006.01)
B08B 1/00    (2006.01)
B08B 5/00    (2006.01)
B08B 5/02    (2006.01)

(52) U.S. Cl.
CPC .............. *H01L 21/6833* (2013.01); *B08B 1/00* (2013.01); *B08B 5/00* (2013.01); *B08B 5/02* (2013.01); *B08B 7/00* (2013.01); *B08B 7/0071* (2013.01)

(58) Field of Classification Search
CPC .......... B08B 1/00; B08B 7/00; B08B 7/0071; B08B 7/0092; B08B 5/00; B08B 5/02
See application file for complete search history.

(56) References Cited

U.S. PATENT DOCUMENTS

| | | | |
|---|---|---|---|
| 7,567,421 B2 * | 7/2009 | Miyashita | 361/234 |
| 2008/0092806 A1 * | 4/2008 | West et al. | 118/70 |
| 2010/0088872 A1 * | 4/2010 | Shih | 29/402.01 |
| 2012/0118510 A1 * | 5/2012 | Banda et al. | 156/704 |
| 2012/0154974 A1 * | 6/2012 | Bhatnagar et al. | 361/234 |

* cited by examiner

*Primary Examiner* — Bibi Carrillo
(74) *Attorney, Agent, or Firm* — Martina Penilla Group, LLP

(57) ABSTRACT

A method of removing an epoxy band from an electrostatic chuck includes securing the electrostatic chuck in a servicing fixture, applying a thermal source to the epoxy band to breakdown a plurality of adhesive bonds securing the epoxy band to the electrostatic chuck, forming a hole in the epoxy band and pulling the epoxy band from the electrostatic chuck. A system for removing an epoxy band from an electrostatic chuck is also described.

12 Claims, 10 Drawing Sheets

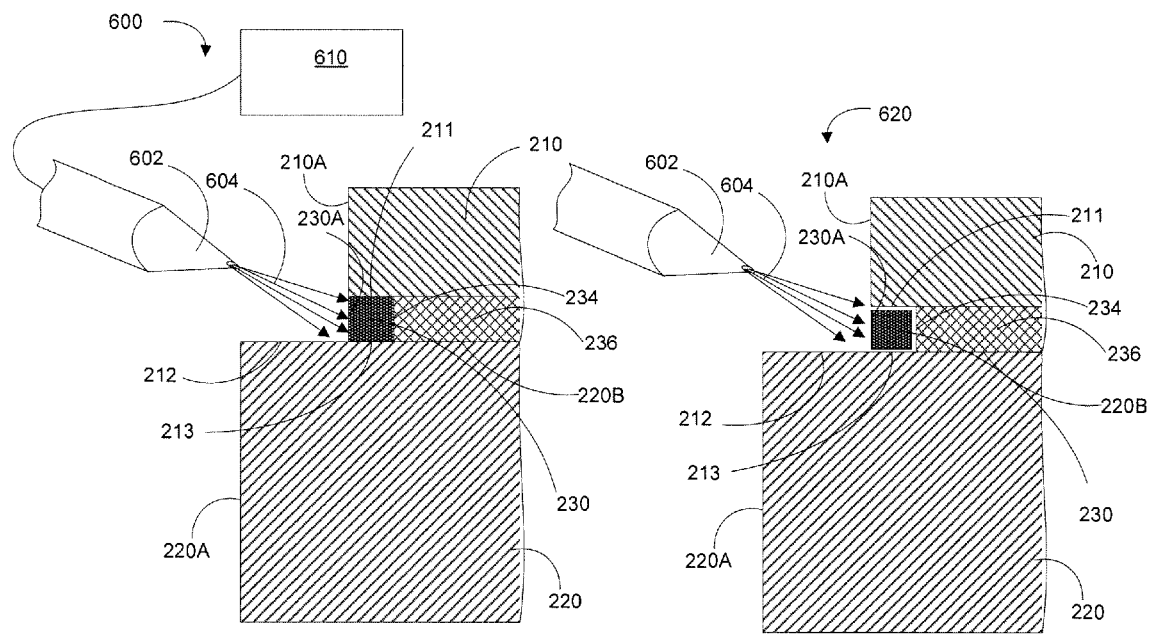
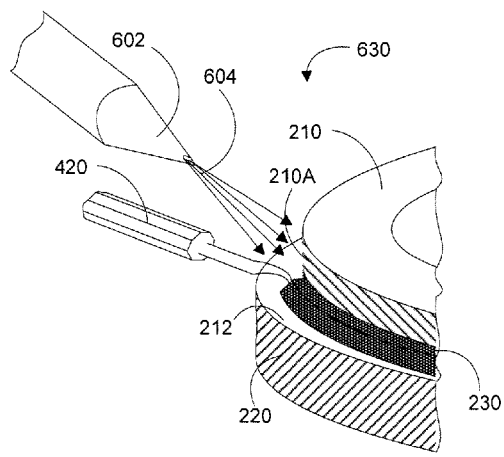
Fig. 6A  Fig. 6B
Fig. 6C

METHOD OF REMOVING DAMAGED EPOXY FROM ELECTROSTATIC CHUCK

BACKGROUND

The present invention relates generally to semiconductor process chambers and more particularly, to systems, methods and apparatus for refurbishing an electrostatic chuck from a semiconductor process chamber.

Semiconductor process chambers typically use an electrostatic chuck to secure the workpiece (e.g., semiconductor wafer) as the workpiece is being processed (e.g., etched, cleaned, imaged, deposition processes, etc.).

Unfortunately, the various processing of the workpiece can also cause unwanted deposits (e.g., etch residue polymers, particles, etc.) to form and adhere to the electrostatic chuck. The unwanted deposits can also flake off or otherwise transfer from the electrostatic chuck to contaminate the present or a subsequent workpiece being secured to the electrostatic chuck for processing.

The electrostatic chuck is periodically removed from the processing chamber and replaced with a new electrostatic chuck to prevent the contamination of workpieces. The electrostatic chuck is a complex and expensive component of the semiconductor process chamber. Replacing the electrostatic chuck increases the cost of operation of the semiconductor process chamber.

In view of the foregoing, there is a need for an effective electrostatic chuck refurbishing system, method and apparatus so a refurbished electrostatic chuck can be reused.

SUMMARY

Broadly speaking, the present invention fills these needs by providing an electrostatic chuck refurbishing system, method and apparatus. It should be appreciated that the present invention can be implemented in numerous ways, including as a process, an apparatus, a system, computer readable media, or a device. Several inventive embodiments of the present invention are described below.

One embodiment provides a method of removing an epoxy band from an electrostatic chuck including securing the electrostatic chuck in a servicing fixture, applying a thermal source to the epoxy band to breakdown adhesive bonds securing the epoxy band to the electrostatic chuck, forming a hole in the epoxy band and pulling the epoxy band from the electrostatic chuck.

Applying the thermal source to the epoxy band to breakdown the adhesive bonds securing the epoxy band to the electrostatic chuck can include determining a width of an outside surface of the epoxy band, selecting a heated tip tool having a width less than the width of the epoxy band, heating the selected heated tip tool to operating temperature and applying the heated tip tool to the outside surface of the epoxy band to heat the epoxy band and breakdown a plurality of adhesive bonds securing the epoxy band to the electrostatic chuck.

Forming the hole in the epoxy band can include pressing the heated tip tool into the epoxy band to forming the hole in the epoxy band. Applying the heated tip tool to the outside surface of the epoxy band can include applying heated air having a temperature of between about 90 and 110 degrees C.

Applying the thermal source to the epoxy band to breakdown the adhesive bonds securing the epoxy band to the electrostatic chuck can include applying a coolant to the epoxy band. Applying a coolant to the epoxy band can include directing a coolant nozzle toward an outside surface of the epoxy band, the coolant nozzle being coupled to a coolant source. Applying a coolant to the epoxy band can include cooling the epoxy band to a temperature of between about 40 degrees C. to about 100 degrees C. less than the temperature of the electrostatic chuck. Forming the hole in the epoxy band and pulling the epoxy band from the electrostatic chuck can include applying the coolant to the epoxy band at a pressure of between about 50 psi to about 80 psi.

The servicing fixture can include a perimeter frame having an inner diameter greater than an outer perimeter of the electrostatic chuck, multiple extensions extending from the inner diameter of the perimeter frame to near the outer perimeter the electrostatic chuck and a corresponding multiple fasteners, each one of the fasteners extending through a corresponding one of the extensions toward the outer perimeter the electrostatic chuck.

Pulling the epoxy band from the electrostatic chuck can include pulling the epoxy band with a pick tool. The pick tool can be formed from a material that is softer than a top layer and a surface of a base of the electrostatic chuck.

Another embodiment provides a system for removing an epoxy band from an electrostatic chuck. The system includes a servicing fixture and a thermal source. The servicing fixture includes a perimeter frame having an inner diameter greater than an outer perimeter of the electrostatic chuck, multiple extensions extending from the inner diameter of the perimeter frame to near the outer perimeter the electrostatic chuck and a corresponding set of fasteners, each one of the fasteners extending through a corresponding one of the extensions toward the outer perimeter the electrostatic chuck, securing the electrostatic chuck in the servicing fixture.

The system can also include a pick tool formed from a material that is softer than a top layer and a surface of a base of the electrostatic chuck. The thermal source can include a heated tip tool. The heated tip tool having a tip width less than a width of an outer surface of an epoxy band on the electrostatic chuck.

The thermal source can include a coolant nozzle coupled to a coolant source and directed toward an outer surface of an epoxy band on the electrostatic chuck. The servicing fixture can include multiple legs for supporting the servicing fixture away from a work surface.

Yet another embodiment provides a method of removing an epoxy band from an electrostatic chuck. The method includes securing the electrostatic chuck in a servicing fixture, applying a previously heated tip tool to the outside surface of the epoxy band to heat the epoxy band to breakdown multiple adhesive bonds securing the epoxy band to the electrostatic chuck. A hole is formed in the epoxy band. A coolant nozzle is directed toward the hole in the epoxy band, the coolant nozzle being coupled to a coolant source. The coolant is applied to the hole in the epoxy band at a pressure of between about 50 psi to about 80 psi and blowing the epoxy band from the electrostatic chuck with the pressurized coolant flow.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIGS. 6A-6C are simplified diagrams of using a coolant nozzle to remove the epoxy band, in accordance with embodiments of the present invention.

DETAILED DESCRIPTION

Several exemplary embodiments for an electrostatic chuck refurbishing system, method and apparatus will now be described. It will be apparent to those skilled in the art that the present invention may be practiced without some or all of the specific details set forth herein.

The electrostatic chuck can become contaminated by the various processes conducted on the workpiece secured to the electrostatic chuck. As a result, the electrostatic chuck must be periodically cleaned and refurbished.

Figure 1:
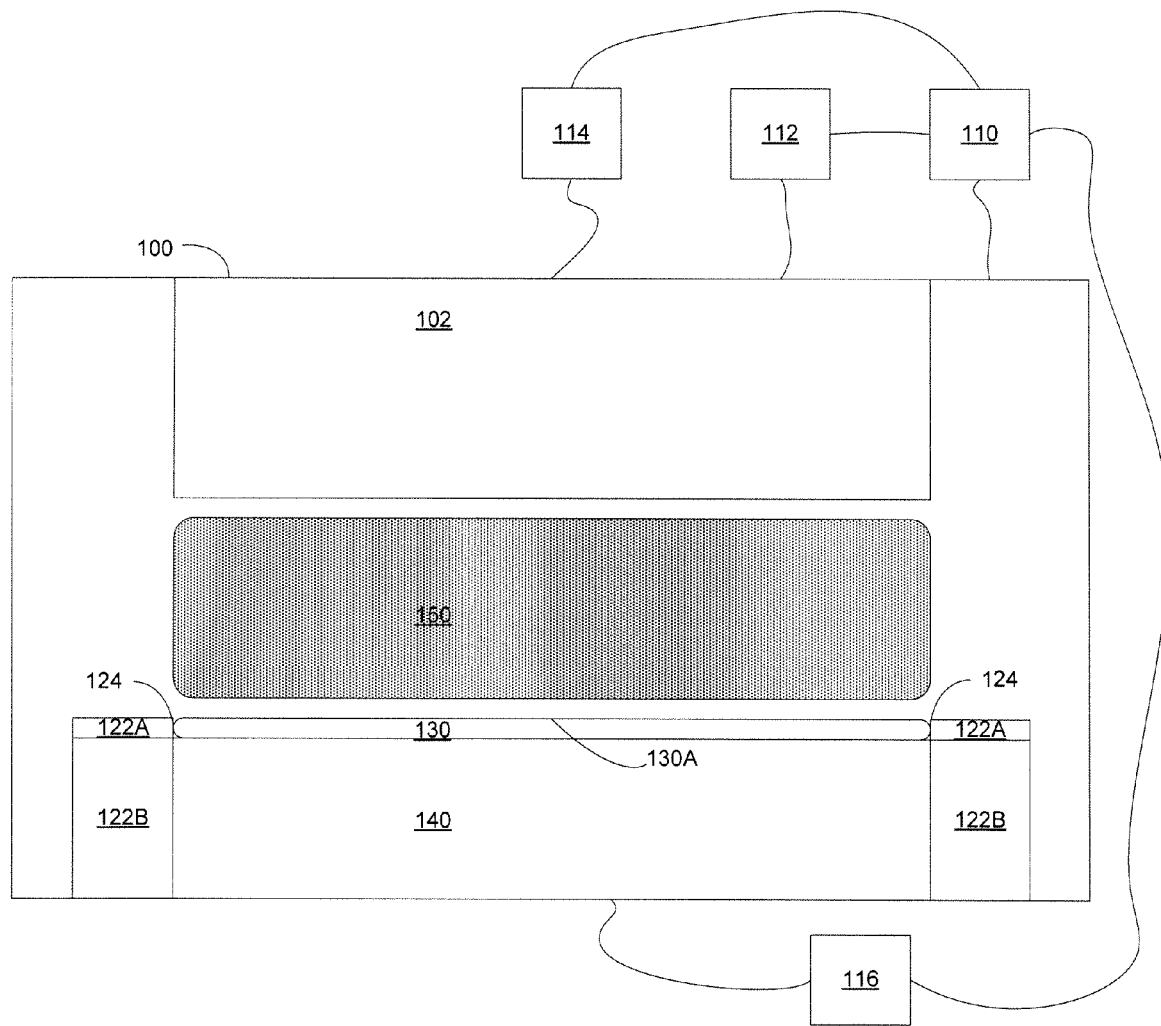
FIG. 1 is a simplified diagram of a plasma processing chamber, in accordance with embodiments of the present invention.

FIG. 1 is a simplified diagram of a plasma processing chamber 100, in accordance with embodiments of the present invention. The plasma processing chamber 100 includes a top electrode assembly 102, an electrostatic chuck 140, and a workpiece 130 secured to the electrostatic chuck 140. The plasma processing chamber 100 is also coupled to one or more process gas sources 112 for delivering process gases to the plasma processing chamber.

A top bias voltage source 114 is coupled to the top electrode assembly 102. A bottom bias voltage source 116 is coupled to the electrostatic chuck 140. A controller 110 is coupled to the plasma processing chamber 100, the one or more process gas sources 112, the top bias voltage source 114 and the bottom bias voltage source 116. The controller 110 includes logic, operating system, operations software and recipes for operating the plasma processing chamber 100 during the various plasma and non-plasma processes conducted in the plasma processing chamber.

Figure 2A:
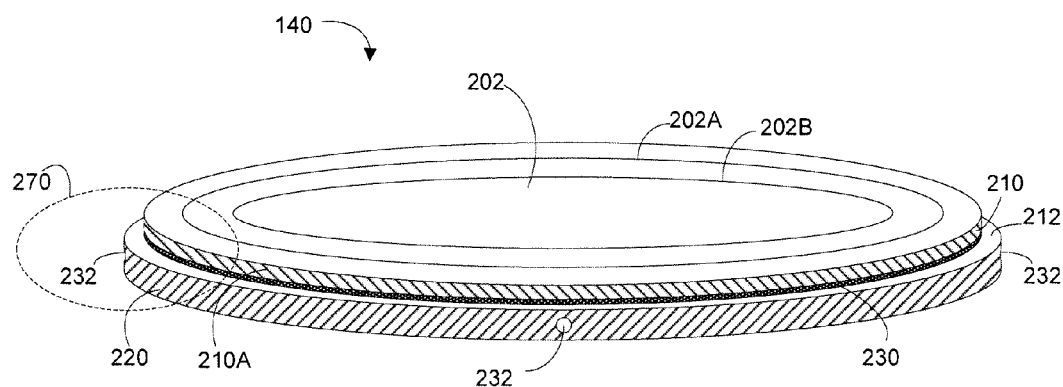
FIG. 2A is a simplified diagram of the electrostatic chuck, in accordance with embodiments of the present invention.
Figure 2B:
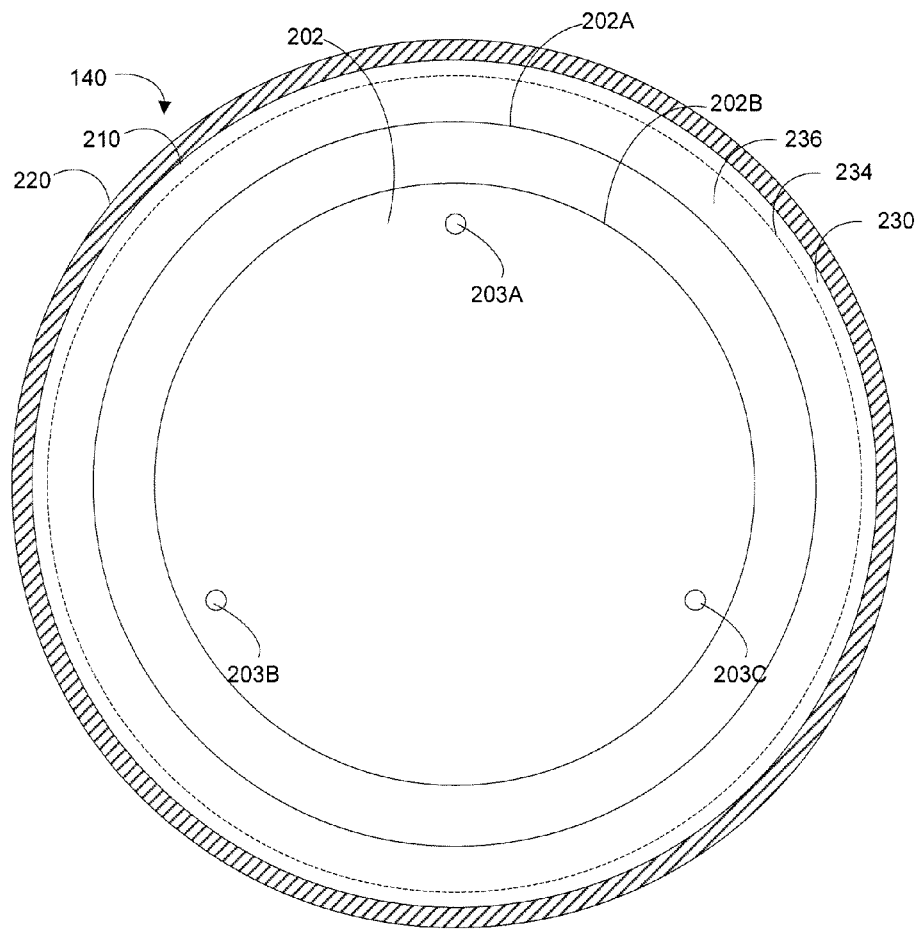
FIG. 2B is a top view of the electrostatic chuck, in accordance with embodiments of the present invention.
Figure 2C:
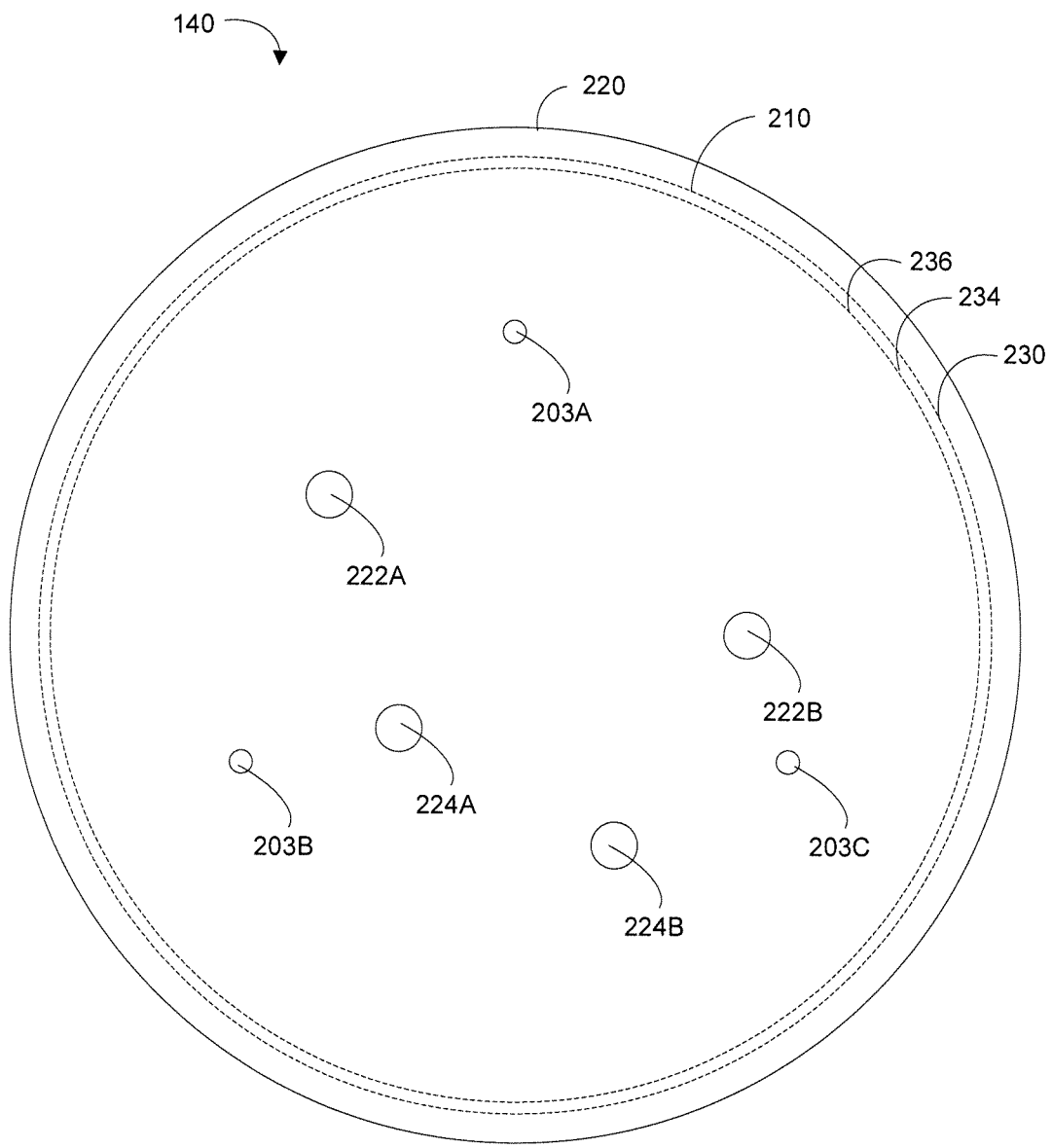
FIG. 2C is a bottom view of an electrostatic chuck, in accordance with embodiments of the present invention.

FIG. 2A is a simplified diagram of the electrostatic chuck 140, in accordance with embodiments of the present invention. FIG. 2B is a top view of the electrostatic chuck, in accordance with embodiments of the present invention. FIG. 2C is a bottom view of an electrostatic chuck, in accordance with embodiments of the present invention. The electrostatic chuck 140 includes a top layer 210 that is manufactured from a ceramic material capable of withstanding the thermal and chemical stresses of the processes conducted in the processing chamber 100.

A top edge ring 122A (shown in FIG. 1) is adjacent to the perimeter of the top layer 210. A bottom edge ring 122B supports the top edge ring 122A and is adjacent to the outer perimeter 220A of the base 220 (shown in FIG. 2E).

The top surface 202 of the top layer 210 includes one or more sets of coolant holes 202A, 202B for delivering a cooling gas flow to a backside of the workpiece 130. The backside of the workpiece 130 is the surface of the workpiece in contact with the electrostatic chuck 140 and opposite the surface 130A exposed to the plasma 150. The one or more sets of coolant holes 202A, 202B are shown in concentric rings, however, it should be understood that the one or more sets of coolant holes can be arranged in more than two rings and in other configurations and varying densities as the coolant holes are distributed radially from near a center of the top surface 202 to outward toward an outer perimeter of the top surface 202.

The top layer 210 can also include electrodes 222A, 222B, 224A, 224B and lift pin holes 203A-C. Lift pins (not shown) can be moved in an upward and a downward direction, substantially perpendicular with the top surface 202, within the lift pin holes 203A-C. The lift pins can extend above the top surface 202 to lift the workpiece 130 away from the top surface. The lift pins can also be retracted into the top layer 210 to lower the workpiece 130 to the top surface 202. It should be noted that the lift pin holes 203A-C are shown disproportionately large relative to a diameter of the top layer 210 for ease of illustration and discussion.

The top layer 210 is coupled to a base 220 by a bonding layer 236. The base 220 is typically a metal material such as aluminum or stainless steel. An epoxy band 230 seals an outer edge of the bonding layer 236 between the top layer 210 and the base 220. The bonding layer 236 thermally couples the top layer 210 to the base 220 while also allowing for any differing thermal expansion and contraction rates of the ceramic top layer and the metallic base.

Figure 2D:
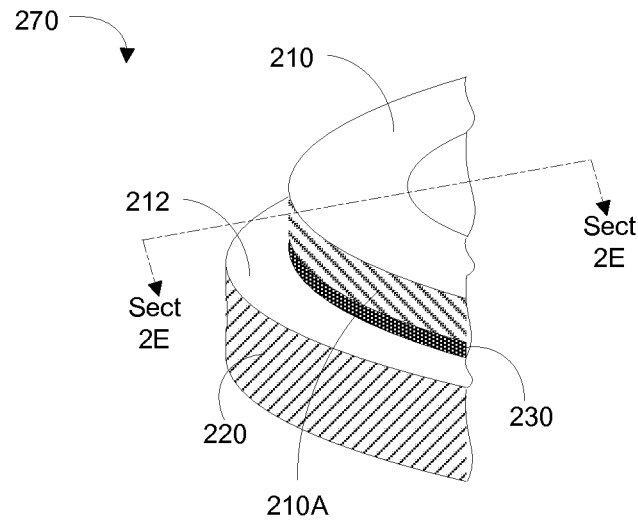
FIG. 2D is a detailed view of a side portion of the electrostatic chuck, in accordance with embodiments of the present invention.
Figure 2E:
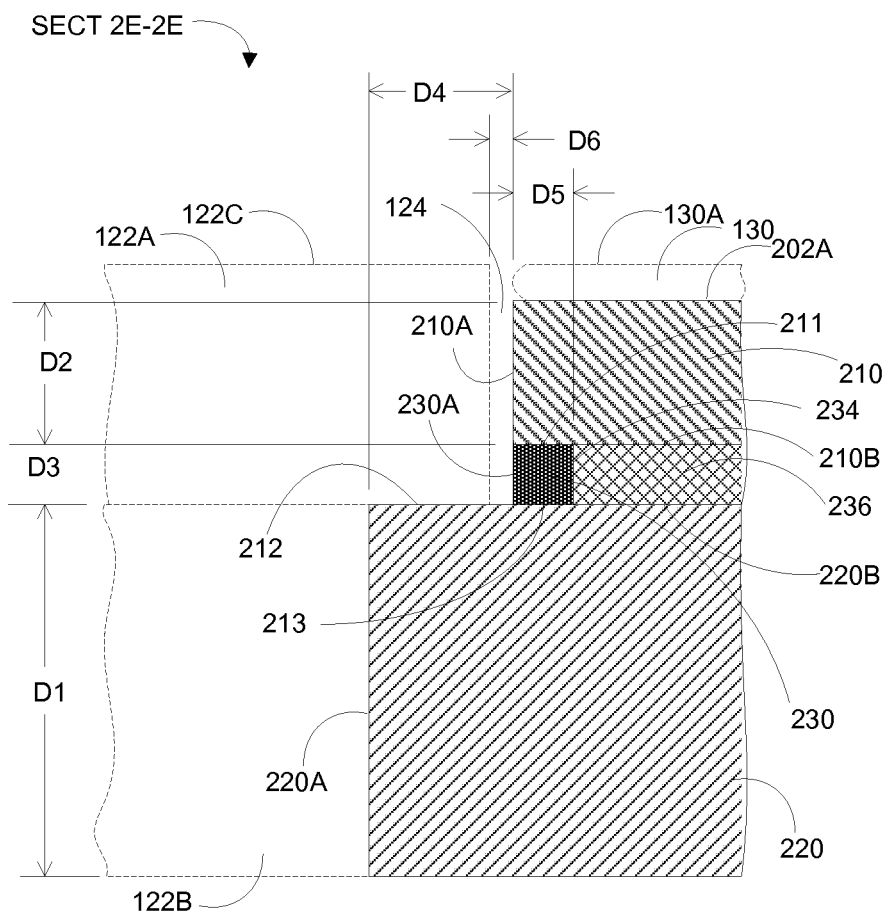
FIG. 2E is a detailed side section view 2E-2E of the electrostatic chuck, in accordance with embodiments of the present invention.

FIG. 2D is a detailed view of a side portion 270 of the electrostatic chuck 140, in accordance with embodiments of the present invention. FIG. 2E is a detailed side section view 2E-2E of the electrostatic chuck 140, in accordance with embodiments of the present invention.

As shown in FIG. 2E, the base has a height of dimension D1 of between about 10.0 mm and about 40.0 mm. The top layer 210 has a height of dimension D2 of between about 3.0 mm and about 20.0 mm. The bonding layer 236 and the epoxy band 230 have a thickness of dimension D3 of between about 1.0 mm and about 10.0 mm.

The outer edge 230A of the epoxy band 230 and the outer edge 210A of the top layer 210 are substantially aligned. The outer perimeter 220A of the base 220 extends outward from the outer edge 210A of the top layer 210 a dimension D4 of between about 5.0 mm and about 25.0 mm, thus forming a step portion 212 of the base 220. The epoxy band 230 extends under the top layer 210 a dimension D5 of between about 1.0 mm and about 10.0 mm from the top layer outer edge 210A.

The top edge ring 122A and a bottom edge ring 122B are shown in phantom in FIG. 2E. The top edge ring 122A overlaps the step portion 212 toward the outer edge 210A of the top layer 210. A top surface 122C of the top edge ring 122A can be substantially co planar with the top surface 130A of the workpiece 130. Alternatively, the top surface 122C of the top edge ring 122A can be substantially coplanar (not shown) with the top surface 202 of the electrostatic chuck 140.

A gap 124, having a width D6 of between about 0.5 mm and about 2.0 mm, separates the top edge ring 122A from the outer edge 210A of the top layer 210. The gap 124 allows for differing thermal expansion and contraction of the top edge ring 122A and the top layer 210.

The epoxy band 230 forms a first adhesive bond 234 to the bonding layer 236. The epoxy band 230 also forms a second adhesive bond 211 to a bottom surface 210B of the top layer 210. The epoxy band 230 also forms a third adhesive bond 213 to a top surface 220B of the base 220. The epoxy band 230 effectively seals and protects the bonding layer 236 from the processing chamber through adhesive bonds 211, 213, 234.

The gap 124 allows for a portion of the plasma etch and cleaning byproducts to reach the outer edge 230A of the epoxy band 230. The plasma etch and cleaning byproducts can damage the epoxy band 230. The damage can include polymer (e.g., etch and cleaning byproducts) build-up on the outer edge 230A of the epoxy band 230. The damage can also include degradation of the material in the epoxy band 230. In either instance, the damage to the epoxy band 230 can generate particles that may become detached from the outer edge 230A of the epoxy band 230 and migrate through the gap 124 to the top surface 202 of the top layer 210 and contaminate the present workpiece 130 secured to the electrostatic chuck 140 and/or a subsequent workpiece.

Periodic removal and replacement of the epoxy band 230 is one approach to substantially eliminate the epoxy band as a source of contamination in the electrostatic chuck 140. The epoxy band 230 can be replaced with a new epoxy band 230' or with a plastic band 830 (e.g., an elastomer o-ring of suitable material such as a perfluroroelastomer material.

Figure 3B:
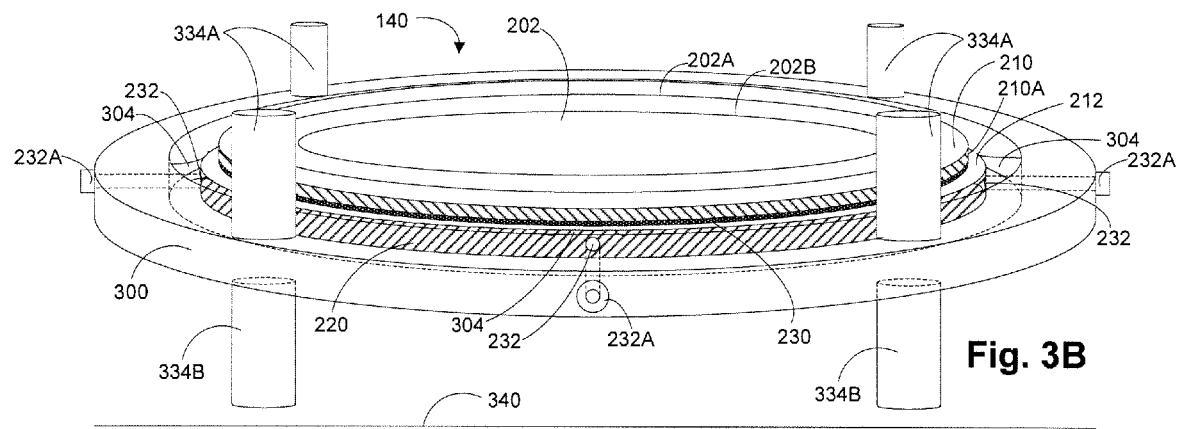
FIGS. 3A and 3B are simplified diagrams of the electrostatic chuck mounted in a servicing fixture, in accordance with embodiments of the present invention.
Figure 3A:
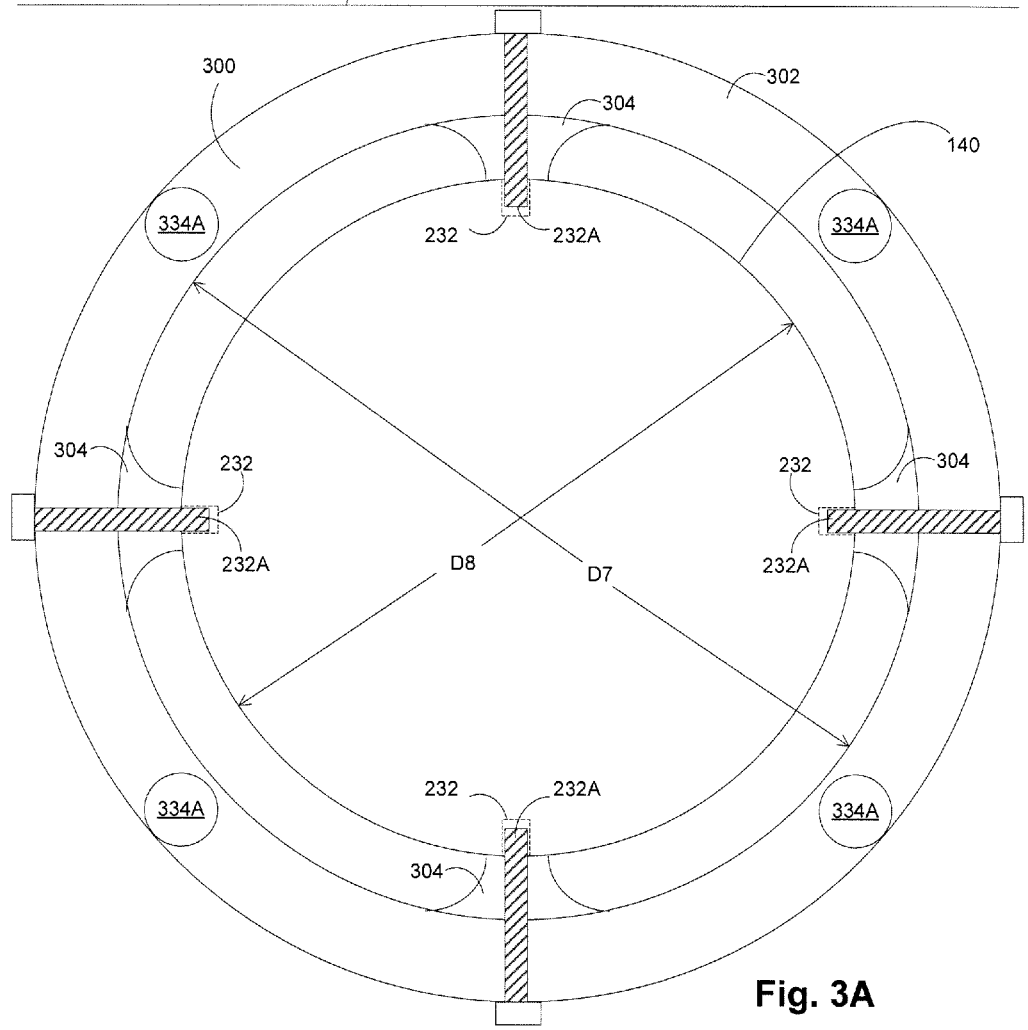

FIGS. 3A and 3B are simplified diagrams of the electrostatic chuck 140 mounted in a servicing fixture 300, in accordance with embodiments of the present invention. The servicing fixture 300 provides a secure handling of the electrostatic chuck 140 for servicing. The servicing fixture 300 can be made from any suitable material such as a plastic, PTFE (Polytetrafluoroethylene), nylon, steel, aluminum or other metal or ceramic material or any other suitable materials and combinations thereof.

The servicing fixture 300 includes a perimeter frame 302 that has an inner diameter D7 greater than a diameter of the D8 of the base 220 of the electrostatic chuck 140. The servicing fixture 300 also includes extensions 304 that extend from the perimeter frame 302 to near the outer perimeter 220A of the base 220. The servicing fixture 300 is shown having a substantially circular outer perimeter, however it should be understood that the outer perimeter of the servicing fixture could be any suitable shape. Other shapes including elliptical, rectangular and other desired shapes of electrostatic chucks can be similarly handled and refurbished as described herein. A correspondingly shaped (e.g., elliptical, rectangular and other desired shape) servicing fixture can also be used. The servicing fixture 300 can also be coupled to one or more additional assemblies including, for example, a work table, an articulating arm, a rotary table or other suitable tooling and fixtures that may aid in the servicing of the electrostatic chuck 140.

The base 220 includes multiple tapped holes 232 that correspond to the extensions 304. It should be noted that while four extensions 304 and four corresponding holes 232 are illustrated, it should be understood that the servicing fixture 300 can include three or more extensions 304 and the base 220 can include a corresponding number of tapped holes 232. Each one of a corresponding number of bolts 232A or other type of suitable fasteners extend through the extensions 304 and thread into the corresponding tapped hole 232 to secure the electrostatic chuck 140 for servicing. It should also be understood that the extensions 304 can be threaded and the bolts 232A can engage the threads in the extensions 304 to create a clamping action around the perimeter of the electrostatic chuck base 220 with or without use of the holes 232 or threads tapped in the holes 232.

The servicing fixture 300 also includes three or more top legs 334A and three or more bottom legs 334B. The top legs 334A and the bottom legs 334B support the electrostatic chuck 140 away from a work surface 340 during servicing.

The epoxy band 230 can be removed from the electrostatic chuck 140 through numerous methods and tools (e.g., grinding, solvents, etc) however many methods are not sufficiently effective for various reasons. Some exemplary reasons for not being sufficiently effective include too slow, excessively labor and/or time intensive, excessive generation of waste streams (e.g., used solvents), excessive risk of damaging the electrostatic chuck 140 and cost. Two methods, or combinations thereof, are described for the removing the epoxy band 230.

Thermal effects such as heating or cooling the epoxy band 230 to a different temperature than the remaining portions of the electrostatic chuck are utilized to ease removal the epoxy band. The epoxy band 230 is a strong glue forming secure bonds 211, 213 and 234. Thus, the epoxy band 230 is difficult to physically pick away from the outer perimeter of the bonding layer 236. It is important to recall that the top layer 210 is a very expensive, relatively fragile ceramic material and even one small chip can ruin the entire top layer 210. It is also important to note that the top surface 220B of the base 220 can be damaged (e.g., gouged, scratched, etc.) if not handled carefully. Thus, the removal tool should avoid physical contact with the top layer 210 and the top surface 220B of the base 220 to prevent additional damage during the removal process.

FIGS. 4A-4D are simplified diagrams 400, 430, 440, 450 of removing the epoxy band 230 with a heated tip tool 402, in accordance with embodiments of the present invention. The heated tip tool 402 has a width D9 that is less than the thickness D3 of the epoxy band 230. By way of example, the heated tip tool 402 has a width D9 that is about 1.0 mm less than the thickness D3 of the epoxy band 230. The width D9 of the heated tip tool 402 is less than the thickness D3 of the epoxy band 230 so that the heated tip tool 402 can apply heat to the outer edge 230A of the epoxy band 230 without contacting either of the bottom surface 210B, top layer 210 or the top surface 220B of the base 220. The heated tip tool 402 can heat the outer edge 230A of the epoxy band 230 to between about 115 degrees C. and about 200 degrees C. The heated tip tool 402 can be a soldering iron type tool with an appropriately sized and shaped heated tip. The heated tip tool 402 is heated to about 155 degrees C. or higher.

Figure 5:
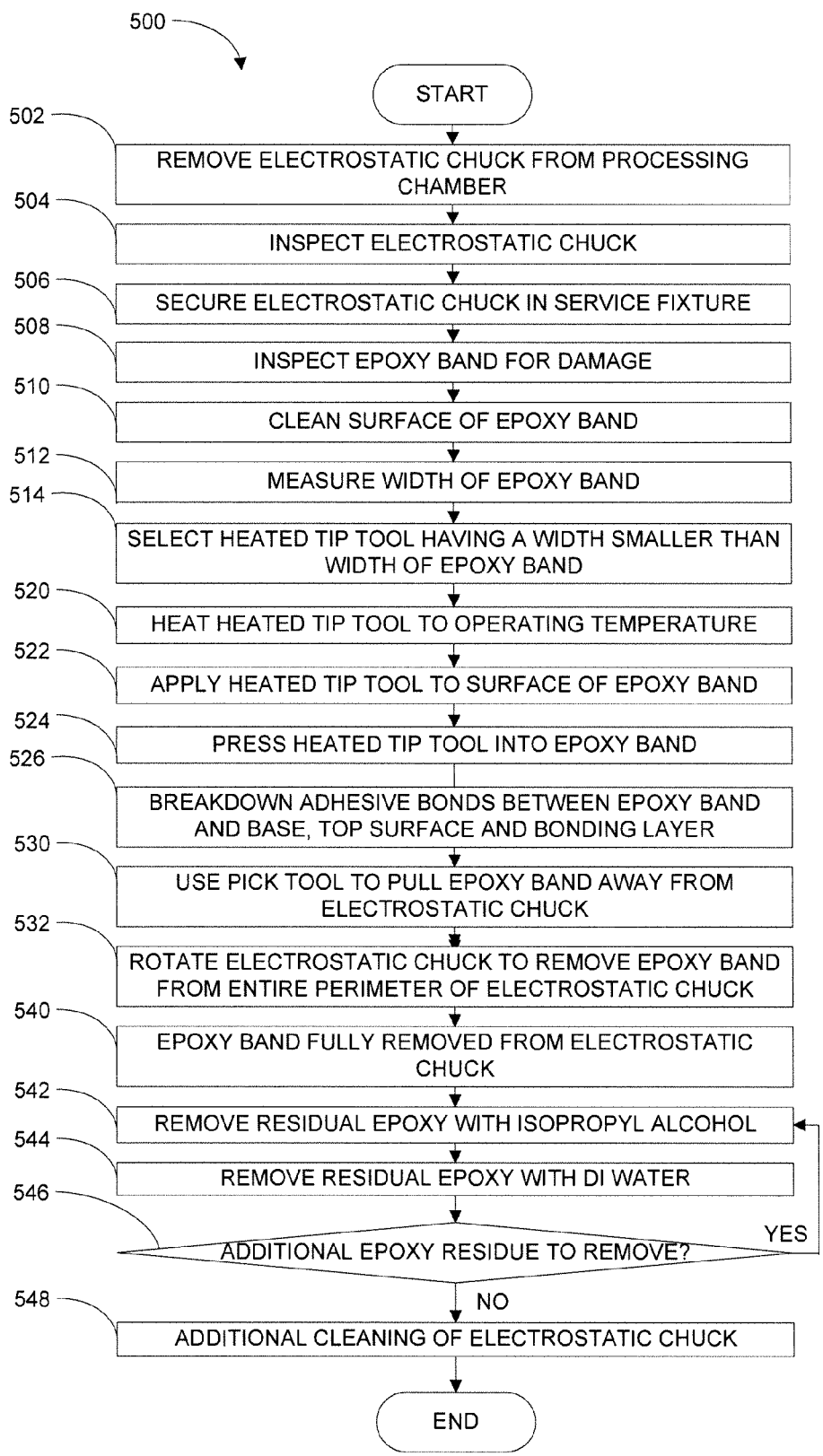
FIG. 5 is a flowchart diagram that illustrates the method operations performed in removing the epoxy band with a heated tip tool, in accordance with embodiments of the present invention.

FIG. 5 is a flowchart diagram that illustrates the method operations 500 performed in removing the epoxy band 230 with a heated tip tool 402, in accordance with embodiments of the present invention. The operations illustrated herein are by way of example, as it should be understood that some operations may have sub-operations and in other instances, certain operations described herein may not be included in the illustrated operations. With this in mind, the method and operations 500 will now be described.

In an operation 502, the electrostatic chuck 140 is removed from the processing chamber 100. The electrostatic chuck 140 is then inspected for any damage on the top layer 210 and the remainder of the electrostatic chuck in an operation 504.

In an operation 506 the electrostatic chuck 140 is secured in the service fixture 300. The outer edge 230A of the epoxy band 230 is inspected for a presence of any etching or cleaning byproduct deposits on the epoxy band in an operation 508. Minor etching or cleaning byproduct deposits on the epoxy band 230 can be removed using cleanroom suitable wipes and isopropyl alcohol (IPA) to carefully wipe the outer edge 230A in an operation 510.

In an operation 512 the dimension D3 is measured on the electrostatic chuck 140. A heated tip tool 402 having a width of about 1.0 mm less than the measured dimension D3 is selected in an operation 514.

In an operation 520, the heated tip tool 402 is heated to operating temperature of about 155 degrees C. or higher. In an operation 522, the heated tip tool 402 is applied to the outer edge 230A of the epoxy band 230. The heated tip tool 402 is applied to the outer edge 230A for between about 10 seconds and about 60 seconds or longer so as to sufficiently heat and soften the epoxy band 230 proximate to the heated tip tool 402. The heated tip tool 402 heats the epoxy band 230 to between about 115 degrees C. and about 200 degrees C. A minimum angle α is maintained between a centerline 402A of the heated tip tool 402 and the top surface 220B of the base 220 to avoid contact with and damage to the top layer 210 and the top surface 220B of the base 220. Angle α is shown exaggerated for illustration purposes. Angle α is typically very near zero degrees so that the centerline of the heated tip tool 402 and the step portion 212 of the base 220 are substantially parallel. Excessive angle α can cause damage to the top layer 210 or the base 220.

In an operation 524, an additional physical pressing force is applied on the outer edge 230A by the heated tip tool 402. The additional physical pressing force will force the heated tip tool 402 into the epoxy band 230 and create a corresponding hole in the epoxy band, as shown in FIG. 4B. Heating the epoxy band 230 breaks down bonds 211, 213 and 234 and in an operation 526, the epoxy band will begin to come out of the space between the top layer 210 and the top surface 220B of the base 220, as shown in FIG. 4C. The heated tip tool 402 should not fully pierce the epoxy band 230 and through the bond 234 as that can damage the bonding layer 236. A suitable heat gun can also be used to heat the epoxy band 230 to between about 90 to about 110 degrees C. or warmer to weaken and breakdown the bonds 211, 213 and 234 to assist in the removal of the epoxy band.

Figure 4A:
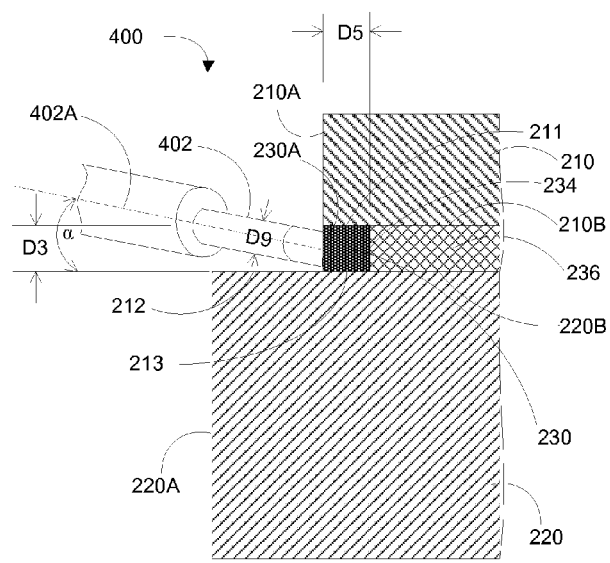
FIGS. 4A-4D are simplified diagrams of removing the epoxy band with a heated tip tool, in accordance with embodiments of the present invention.
Figure 4B:
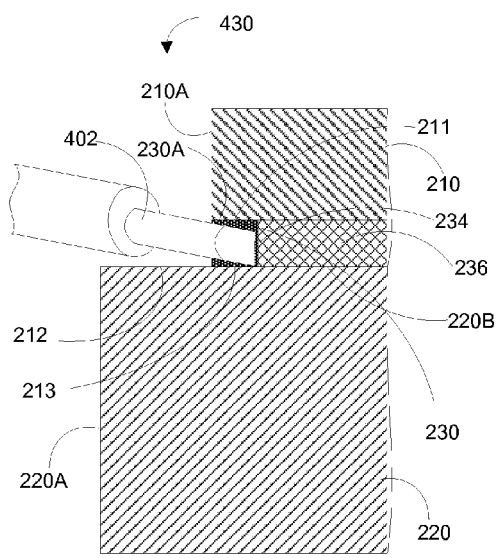
Figure 4C:
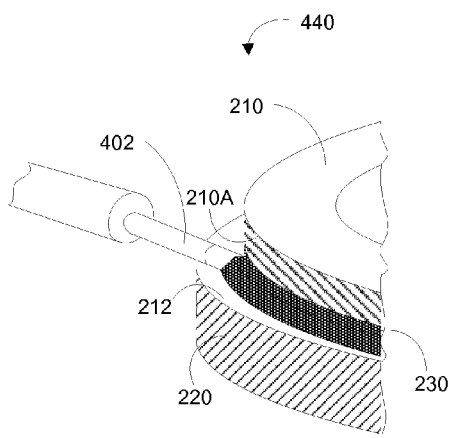
Figure 4D:
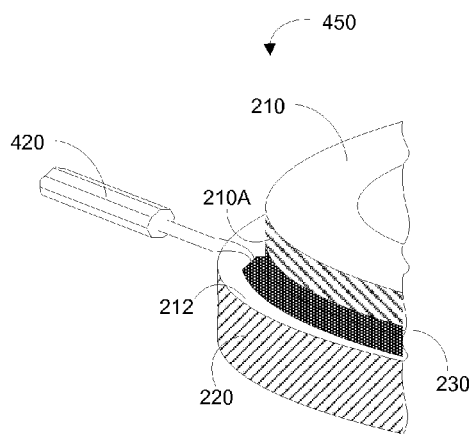

In an operation 530, a special designed pick tool 420 can be used to carefully pick the epoxy band 230 starting from the hole formed by the heated tip tool 402, as shown in FIG. 4D. The pick tool 420 can be formed of any suitable material, preferably a material that is softer than the ceramic top layer 210 and the surface of the base 220 so that the pick tool 420 will not unintentionally damage or scratch the ceramic top layer or the surface of the base. Maintaining an acute angle α between the pick tool 420 and the top surface 220A of the base 220 avoids contact with and potential damage to the top layer 210 and the top surface 220A of the base 220. In an operation 532, the electrostatic chuck 140 is rotated so that the pick can pull out the epoxy band 230 around the complete perimeter of the electrostatic chuck.

In an operation 540, the epoxy band 230 is fully removed from the electrostatic chuck 140. In operations 542-544, IPA and de-ionized (DI) water are used in repetitive iterations to clean the gap between the top layer 210 and the base 220 until any residual epoxy is removed in an operation 546. In an optional operation 548, additional cleaning of the electrostatic chuck 140 can be performed, as needed, and the method operations can end.

Figure 7:
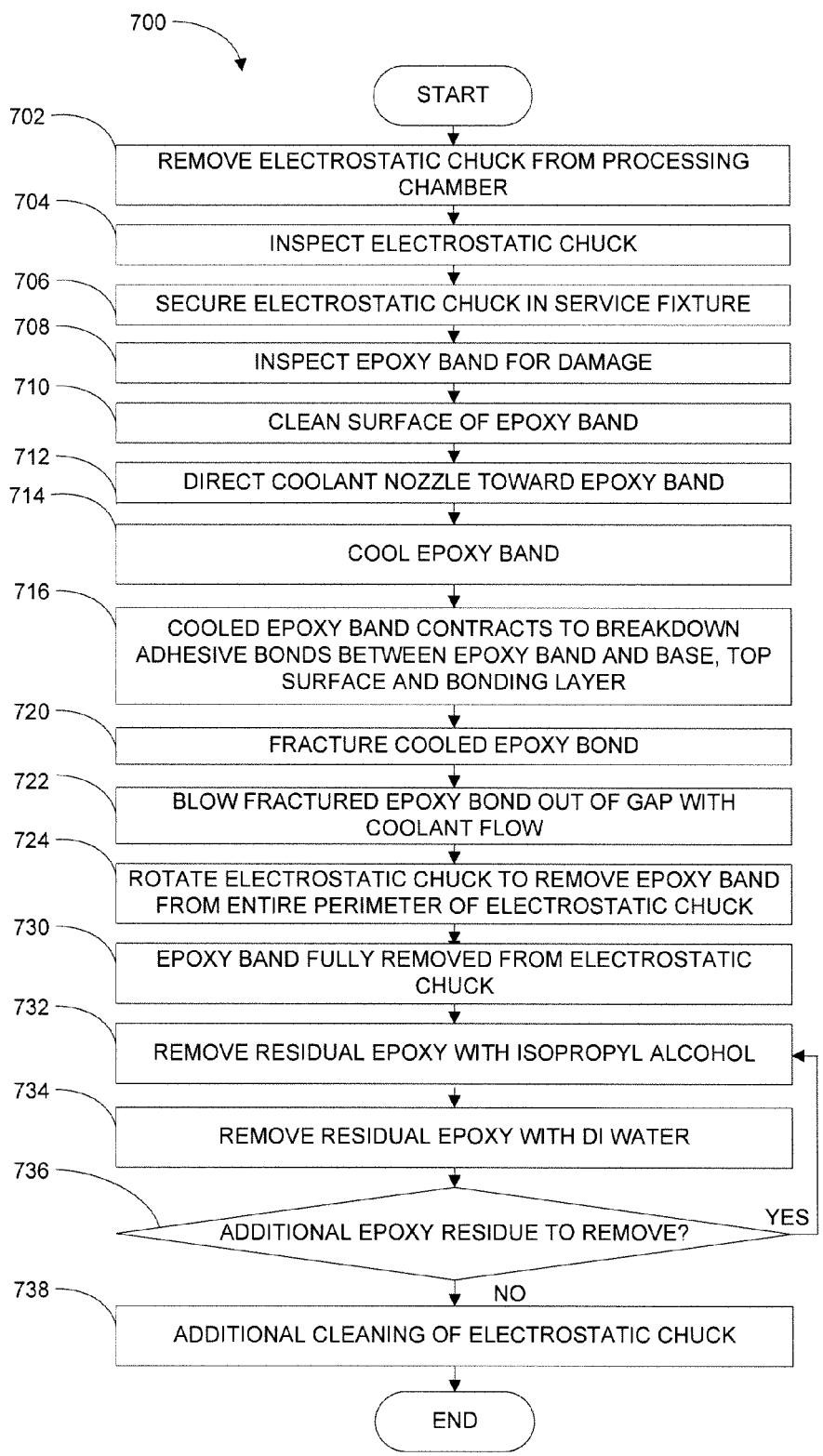
FIG. 7 is a flowchart diagram that illustrates the method operations performed in removing the epoxy band with a coolant nozzle, in accordance with embodiments of the present invention.

Applying a coolant to the epoxy band 230 can weaken the bonds 211, 213 and 234 and thus allowing the epoxy band to be removed from the electrostatic chuck. Using a coolant to remove the epoxy band 230 is especially useful in refurbishing electrostatic chucks where the dimension D3 is less than about 3.0 mm. When D3 is less than about 3.0 mm, it is difficult to insert a heated tip tool 402 into the epoxy band 230 without damaging either the ceramic top layer 210 or the top surface 220B of the base 220. FIGS. 6A-6C are simplified diagrams 600 of using a coolant nozzle 602 to remove the epoxy band 230, in accordance with embodiments of the present invention. FIG. 7 is a flowchart diagram that illustrates the method operations 700 performed in removing the epoxy band 230 with a coolant nozzle 602, in accordance with embodiments of the present invention. The operations illustrated herein are by way of example, as it should be understood that some operations may have sub-operations and in other instances, certain operations described herein may not be included in the illustrated operations. With this in mind, the method and operations 700 will now be described.

In an operation 702, the electrostatic chuck 140 is removed from the processing chamber 100. The electrostatic chuck 140 is then inspected for any damage on the top layer 210 and the remainder of the electrostatic chuck in an operation 704.

In an operation 706 the electrostatic chuck 140 is secured in the service fixture 300. The outer edge 230A of the epoxy band 230 is inspected for a presence of any etching or cleaning byproduct deposits on the epoxy band in an operation 708. Minor etching or cleaning byproduct deposits on the epoxy band 230 can be removed using cleanroom suitable wipes and isopropyl alcohol (IPA) to carefully wipe the outer edge 230A in an operation 710.

In an operation 712, a coolant nozzle 602 is directed to the outer edge 230A of the epoxy band. The coolant nozzle 602 is coupled to a coolant supply 610. The coolant 604 has a temperature of between about 40 degrees C. to about 100 degrees C. less than the temperature of the electrostatic chuck 140. Exemplary coolants 604 include carbon dioxide (CO2). CO2 has a temperature of between about −40 and −80 degrees C. as emitted from the nozzle 602 at pressure of between about 50 psi to about 80 psi. It should be understood that CO2 is an exemplary coolant and other coolants capable of cooling the epoxy band 230 to a temperature of between about 40 degrees C. to about 100 degrees C. less than the temperature of the electrostatic chuck 140 can also be used. The suitable coolants can be liquid, gaseous or solid form. By way of example, dry ice (solid CO2) can be used to cool the epoxy band 230 sufficiently to break the adhesive bonds.

The coolant 604 rapidly cools the epoxy band 230 causing the epoxy band to be come hard and easily fractured or broken in an operation 714. The cooled epoxy band 230 contracts, as shown in FIG. 6B and pulls away from or otherwise defeats adhesive bonds 211, 213, 234, in an operation 716.

In an operation 720, the contracted epoxy band 230 fractures under the pressure and cooling effects of the coolant. A pick tool 420 can also be used to assist in fracturing the epoxy band 230. In an operation 722, the fractured epoxy band 230 is blown out of the gap between the top layer 210 and the base 220. In an operation 724, the electrostatic chuck 140 is rotated so that the coolant can blow out the epoxy band 230 around the complete perimeter of the electrostatic chuck.

In an operation 730, the epoxy band 230 is fully removed from the electrostatic chuck 140. In operations 732-734, IPA and DI water are used in repetitive iterations to clean the gap between the top layer 210 and the base 220 until any residual epoxy is fully removed in an operation 736. In an optional operation 738, additional cleaning of the electrostatic chuck 140 can be performed, as needed, and the method operations can end.

It should be understood that the two methods of heating the epoxy band 230 as described in FIGS. 4A-5, and cooling the epoxy band as described in FIGS. 6A-7, can be used individually or in combination. By way of example, the epoxy band 230 can be heated and then cooled by a coolant to increase the thermal impact to the adhesive bonds 211, 213, 234.

The above described two methods easily remove the epoxy band 230 with less risk to damaging the electrostatic chuck 140. The above described two methods also easily remove the epoxy band 230 without use of aggressive chemical solvents. The above described two methods also economically, efficiently remove the epoxy band 230 thus preparing the electrostatic chuck 140 for the next steps in refurbishment.

Figure 8A:
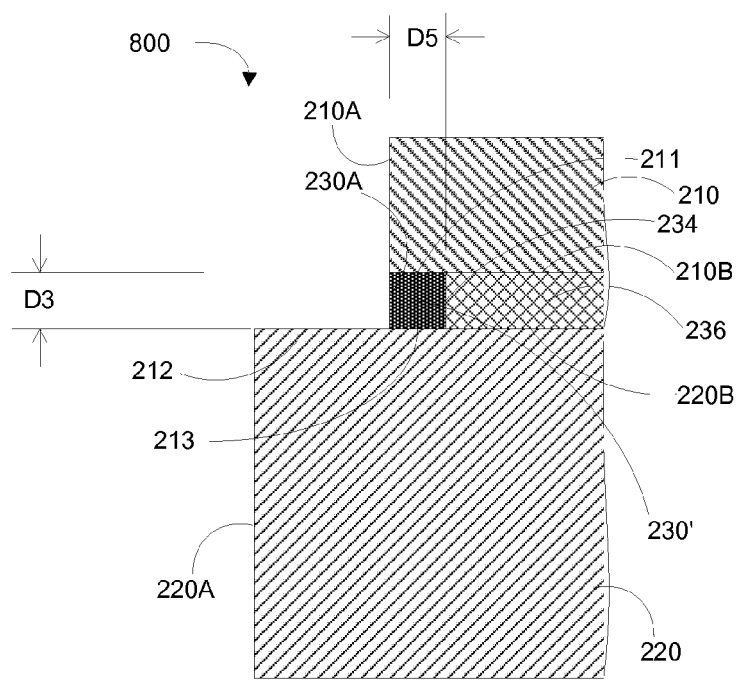
FIG. 8A is a detailed side section view 2E-2E of the electrostatic chuck with new epoxy band installed, in accordance with embodiments of the present invention.

FIG. 8A is a detailed side section view 2E-2E 800 of the electrostatic chuck 140 with new epoxy band installed, in accordance with embodiments of the present invention. After the epoxy band 230 is fully removed and any epoxy band residue is removed, the electrostatic chuck can be refurbished and a new epoxy band 230' installed as shown in FIG. 8A.

Figure 8B:
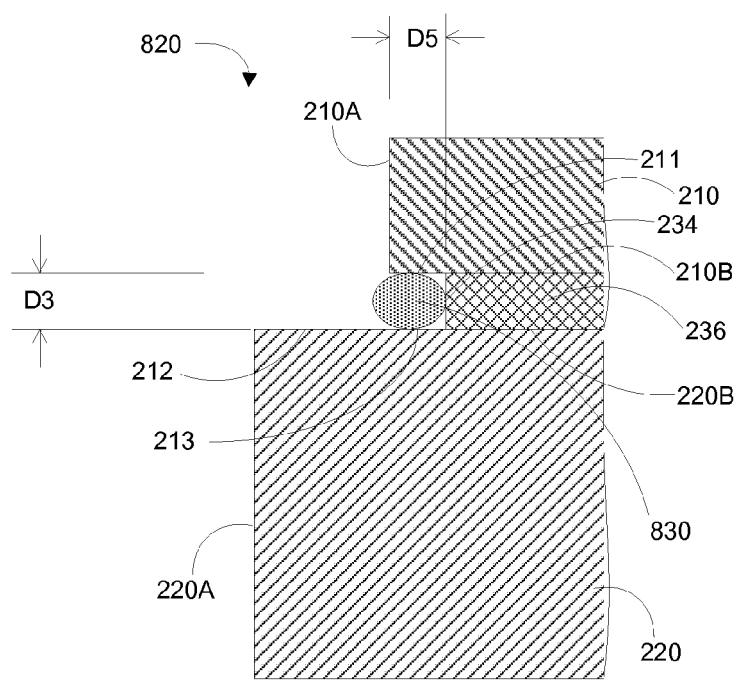
FIG. 8B is a detailed side section view 2E-2E of the electrostatic chuck with an o-ring installed instead of a new epoxy band, in accordance with embodiments of the present invention.

FIG. 8B is a detailed side section view 2E-2E 820 of the electrostatic chuck 140 with an o-ring 830 installed instead of a new epoxy band 203', in accordance with embodiments of the present invention. After the epoxy band 230 is fully removed and any epoxy band residue is removed, the electrostatic chuck can be refurbished and an o-ring 830 installed as shown in FIG. 8B.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of removing an epoxy band from an electrostatic chuck comprising:
   securing the electrostatic chuck in a servicing fixture;
   applying a heated tip tool to the epoxy band to heat the epoxy band between about 90 and 110 degrees C. to breakdown a plurality of adhesive bonds securing the epoxy band to the electrostatic chuck;
   forming a hole in the epoxy band; and
   pulling the epoxy band from the electrostatic chuck.

2. The method of claim 1, wherein applying the heated tip tool to the epoxy band to breakdown the plurality of adhesive bonds securing the epoxy band to the electrostatic chuck includes:
   determining a width of an outside surface of the epoxy band;
   selecting the heated tip tool having a width less than the width of the epoxy band; and
   applying the heated tip tool to the outside surface of the epoxy band to heat the epoxy band and breakdown a plurality of adhesive bonds securing the epoxy band to the electrostatic chuck.

3. The method of claim 1, further comprising applying a coolant to the epoxy band.

4. The method of claim 1, wherein pulling the epoxy band from the electrostatic chuck includes pulling the epoxy band with a pick tool.

5. The method of claim 2, wherein forming the hole in the epoxy band includes: pressing the heated tip tool into the epoxy band to forming the hole in the epoxy band.

6. The method of claim 3, wherein applying a coolant to the epoxy band includes:
   directing a coolant nozzle toward an outside surface of the epoxy band, the coolant nozzle being coupled to a coolant source.

7. The method of claim 3, wherein applying a coolant to the epoxy band includes cooling the epoxy band to a temperature of between about 40 degrees C. to about 100 degrees C. less than a temperature of the electrostatic chuck.

8. A method of removing an epoxy band from an electrostatic chuck comprising:
   securing the electrostatic chuck in a servicing fixture;
   applying a thermal source to the epoxy band to breakdown a plurality of adhesive bonds securing the epoxy band to the electrostatic chuck;
   forming a hole in the epoxy band;
   pulling the epoxy band from the electrostatic chuck; and
   applying a coolant to the epoxy band;
   wherein forming the hole in the epoxy band and pulling the epoxy band from the electrostatic chuck includes applying the coolant to the epoxy band at a pressure of between about 50 psi to about 80 psi.

9. The method of claim 1, wherein the servicing fixture includes:
   a perimeter frame having an inner diameter greater than an outer perimeter of the electrostatic chuck;
   a plurality of extensions extending from the inner diameter of the perimeter frame to near the outer perimeter of the electrostatic chuck; and
   a corresponding plurality of fasteners, each one of the plurality of fasteners extending through a corresponding one of the extensions toward the outer perimeter the electrostatic chuck.

10. The method of claim 8, wherein applying the coolant to the epoxy band includes cooling the epoxy band to a temperature of between about 40 degrees C. to about 100 degrees C. less than a temperature of the electrostatic chuck.

11. A method of removing an epoxy band from an electrostatic chuck comprising:
   securing the electrostatic chuck in a servicing fixture;
   applying a previously heated tip tool to an outside surface of the epoxy band to heat the epoxy band and breakdown a plurality of adhesive bonds securing the epoxy band to the electrostatic chuck;
   forming a hole in the epoxy band;
   directing a coolant nozzle toward the hole in the epoxy band, the coolant nozzle being coupled to a coolant source;
   applying the coolant to the hole in the epoxy band at a pressure of between about 50 psi to about 80 psi; and blowing the epoxy band from the electrostatic chuck with the pressurized coolant flow.

12. The method of claim 11, wherein applying the coolant to the hole in the epoxy band cools the epoxy band to a temperature of between about 40 degrees C. to about 100 degrees C. less than a temperature of the electrostatic chuck.

* * * * *